TRANSIENT OVERDRIVE FOR DIODE-TRANSISTOR-LOGIC CIRCUITS

Filed Feb. 24, 1966

INVENTOR.
HUA-THYE CHUA
BY [signature]
Samuel Lindenberg
ATTORNEYS

United States Patent Office 3,427,474

Patented Feb. 11, 1969

3,427,474
TRANSIENT OVERDRIVE FOR DIODE-TRANSISTOR-LOGIC CIRCUITS

Hua Thye Chua, Sunnyvale, Calif., assignor to Fairchild Camera and Instrument Corporation, Syosset, N.Y., a corporation of Delaware Filed Feb. 24, 1966, Ser. No. 529,677
U.S. Cl. 307—246 6 Claims
Int. Cl. H03k 17/04, 19/08

ABSTRACT OF THE DISCLOSURE

A diode-transistor logic circuit having an improved technique for charged stray capacitance, including an extra transistor coupled between the collector of one transistor and the collector of another transistor to enable a large current to flow from one transistor to the other when the first is placed in the active region until the second is placed into the active region.

This invention relates to diode-transistor-logic circuitry, and more particularly to an arrangement whereby the switching speed of the circuitry is increased.

Diode-transistor-logic circuits are currently being used extensively. These circuits are usually referred to as DTL circuits. One of the problems which arises when one attempts to achieve high switching speed with DTL circuits is caused by wiring and interelectrode capacitance usually called stray capacitance, which normally is present with the components which are being used. It is customary to couple the transistors and/or diodes to a source of potential through resistors. Thus, the charge or discharge of the stray capacitance must usually occur through the resistors. If the resistor values selected are too high, then the charge and discharge time is lengthened considerably. If the resistor values are selected to be low, then usually a heavier current is required and an increase in power dissipation results.

The effects of stray capacitance may be minimized for example, in a circuit of the type wherein each of a first and second transistor has a base, collector, and emitter, and a diode couples the emitter of the first transistor to the base of the second transistor. Two input terminals are provided for coupling the circuit to a source of operating potential. A resistance means couples the collector of the second transistor to one of the input terminals and there is a means coupling the emitter of the second transistor to the other input terminal. The improvement of the invention comprises current conducting means connected between a means for charging the stray capacitance of the circuit, including first and second transistor collectors which enables a large current to flow to the first transistor when the first transistor is placed into the active region, for charging up the stray capacitance until the second transistor is placed into the active region.

Upon the application of an energizing signal to the input to the circuitry of the invention, a heavy current is permitted to flow into the input which serves to rapidly charge up the circuit capacitance. As the output element of the circuit begins to produce an output signal, the heavy current flow diminishes until normal current flow into the input of the circuit is reached. Thus, a charging current is provided only when needed and in sufficient quantity to do the job as quickly and as expeditiously as possible.

The circuit of the present invention steers the transient current which normally constitutes a load to the circuit into the input in a manner so as to charge the stray capacitance of the circuit. Thus its speed of operation is increased with no increase in power dissipation.

The novel features that are considered characteristic of this invention are set forth with particularity in the appended claims. The invention will best be understood from the following description when read in connection with the accompanying drawings, in which:

Figure 1:
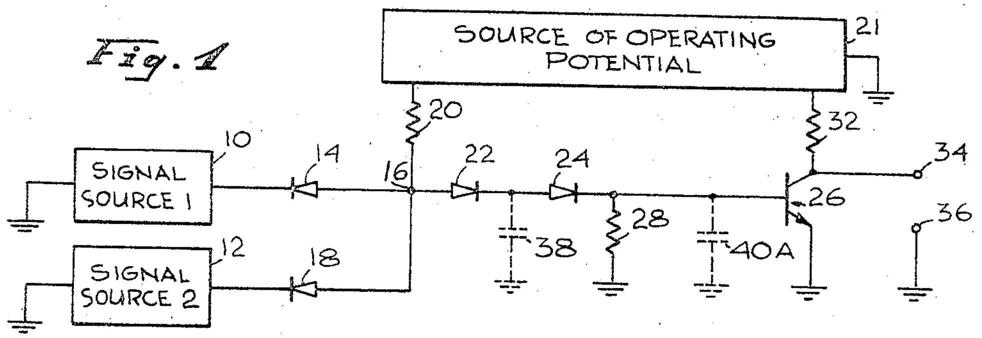
FIGURE 1 is a circuit diagram of a conventional DTL circuit.

A DTL logic package normally comprises an input logical gating arrangement followed by a DTL circuit which is driven in response to the output of the logical gating arrangement. FIGURE 1 exemplifies such a circuit. The input logical gating arrangement comprises, by way of example, an And gate which drives DTL circuitry. A first and second signal source 10 and 12 respectively apply first and second signals to the And gate. The And gate includes a diode 14 connected between the first signal source and a junction point 16; a diode 18 connected between the second signal source and a junction 16; and a resistor 20 connected to the positive terminal 21A of a source of operating potential 21. If one or both signals are of a relatively low potential, current flows from the positive potential source through the resistor 20 and through one or the other or both of the diodes 14 and 18 to maintain the potential of the junction point 16 relatively low until a relatively high signal is applied to both the diodes 14 and 18 simultaneously to block conduction through them, whereupon the potential at the junction point 16 rises.

Two diodes respectively 22 and 24 are connected in series between the output of the And gate at junction 16 to the base of a NPN transistor 26. A resistor 28 connects the base of transistor 26 to the other terminal of the source of operating potential 21, as in this embodiment, that terminal is ground. The collector of transistor 26 is connected through a resistor 32 to the positive terminal 21A of the source of operating potential 21. A pair of output terminals respectively 34 and 36 are connected to the collector of transistor 26 and ground. The stray capacitance of the circuit is represented by only two dotted line capacitors 38 and 40A, although more of these exist.

Before any substantial output can be detected from the output terminals 34 and 36, the stray capacitance of the circuit must be charged up. The charging current useful for this must flow through the resistor 20 and the diode 22. It will be appreciated that these elements limit the amount of charging current available. The selection of the proper value for the resistor 20 involves a compromise between speed and power dissipation. A small resistor provides a large charging current increasing the speed of operation but also since the current is maintained, it increases the power dissipation. A large resistor has the opposite effect. Neither is desirable.

Figure 2:
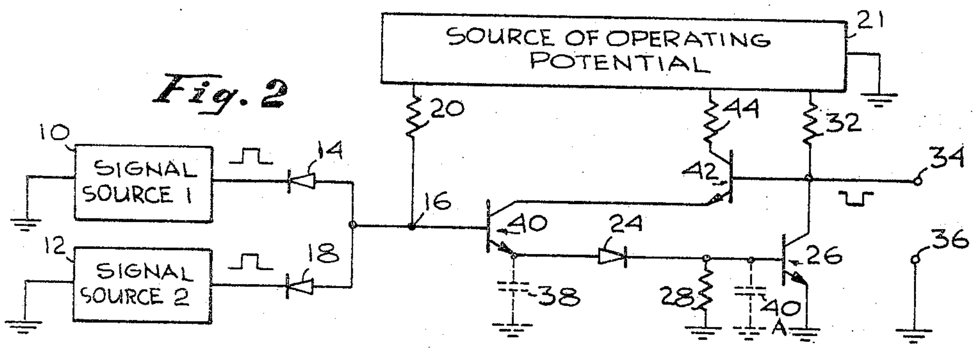
FIGURE 2 is a circuit diagram of an embodiment of the invention.

A DTL circuit modified in accordance with this invention is shown in FIGURE 2. Components which function similar to those in FIGURE 1 have the same reference numerals applied to them. In place of diode 22, an NPN transistor 40 is employed having its base connected to the And gate output at a junction 16, its emitter connected to the diode 24, and its collector connected to the emitter of another transistor 42. The transistor 42 has its collector connected to the operating potential source 21 through a resistor 44. This circuit operates upon the application of an input signal to rapidly charge up the stray capacitance, and to turn off the charging current when the charging operation is finished.

Assume that the And gate portion of the circuit in FIGURE 2 has not yet raised the potential of the junction 16 since there is no coincidence of "high" level inputs to the diodes 14 and 18. In that situation, transistors 40 and 26 are in their non-conductive or cut-off states. The transistor 42 has its base essentially connected to the positive terminal 21A of the source of positive potential 21, since the transistor 26 is not drawing any current. However, since transistor 40 is also cut off, transistor 42 may be said to be in its operative state but no current can flow therethrough. As soon as the potential at junction point 16 rises in response to coincidence of relatively "high" level inputs to the And gate, transistor 40 is placed into the active region. As a result, a current can flow through transistor 42 in a path through the collector and emitter of transistor 40, through the diode 24, and through the resistor 28 to ground. This current flow is heavy and rapidly charges up the stray capacitors 38 and 40A. As these capacitors begin to be charged up, transistor 26 is turned on, whereby it draws collector current and a negative going output signal can be detected between terminals 34 and 36. This negative going output signal, which is also applied to the base of transistor 42, decreases the current that flows through transistor 42, thus cutting off the heavy charging current when the charging function is accomplished. The transistor 26 remains turned on by base current flowing from the potential supply source through resistor 20, emitter-base junction of transistor 40 and diode 24 as long as the input signals remain in "high" state, even though the capacitance charging current is cut off. When one of the input signals becomes "low," the quiescent conditions described previously are re-established, with transistors 40 and 26 being rendered inactive and transistor 42 being placed in its "standby operative" condition.

Figures 3, 4:
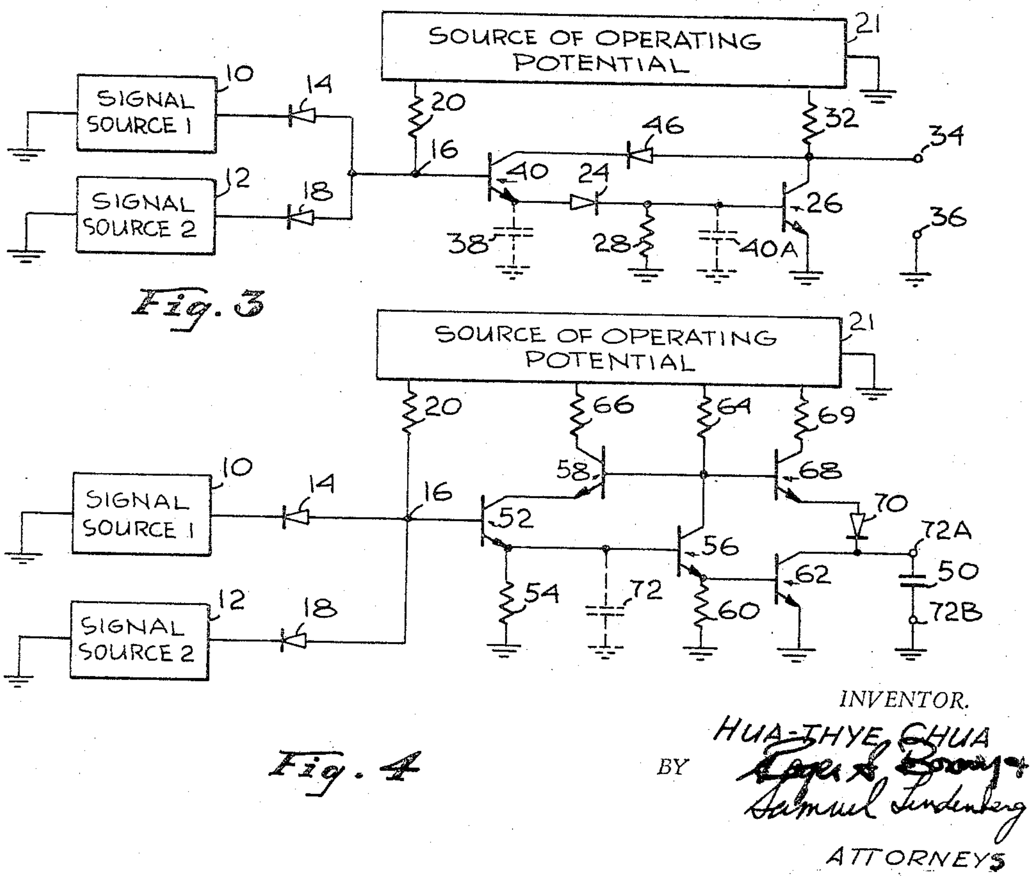
FIGURE 3 is a circuit diagram showing another arrangement for an embodiment of the invention.
FIGURE 4 is a circuit diagram showing still another arrangement for an embodiment of the invention.

FIGURE 3 is a circuit diagram of another embodiment of the invention wherein, instead of a transistor 42 being employed in the charging current path, a diode 46 is employed. The remainder of the circuit, which functions in the same manner as was described in FIGURE 2, has the same reference numerals applied thereto. When transistor 40 is non-conductive, no current flows from the source of potential through the resistor 32 through the diode 46. When there is a coincidence of "high" input signals to the And gate, the transistor 40 is placed into the active region. There is a heavy flow of current through resistor 32, diode 46, through transistor 40 to charge up the stray capacitance 38 and 40A.

Transistor 26 is rendered conductive as the stray capacitance 38 and 40A is charged up, and the potential at the transistor 26 collector drops. At this time, since the path provided by the diode 46, transistor 40, diode 24, and resistor 28 has a higher impedance than the path through the transistor 26, the charging current flow through diode 46 drops. However, emitter-base junction of transistor 40 is provided with enough current from the supply source 21 through resistor 20 to maintain transistor 26 in the active region as long as the potential applied to the base of transistor 40 maintains it conductive. Thus, the circuit arrangement shown in FIGURE 3 provides extra current for charging the interelectrode capacitance only for as long a period as it is needed.

FIGURE 4 is a circuit arrangement illustrating the use of the embodiment of the invention with a load 50. Load 50 is illustrated as a capacitor, but may be resistive or inductive. Again, the logic shown, by way of example, comprises the same type of And gate as is shown in FIGURES 1 and 2, and therefore the components bear the same reference numerals. The output of the And gate at junction 16 is connected to the base of an NPN transistor 52. The emitter of this transistor is connected to ground through a resistor 54, and to the base of a succeeding transistor 56. The collector of the transistor

52 is connected to the emitter of a transistor 58. The emitter of transistor 56 is connected to ground through a resisor 60, and is also connected to the base of a succeeding output transistor 62. The collector of transistor 56 is connected to the positive terminal 21A of the source of operating potential 21 through a resistor 64.

The collector of transistor 58 is connected to terminal 21A of the source of operating potential through a resistor 66. The base of transistor 58 is connected to the collector of transistor 56. The base of the transistor 68 is connected to the junction of resistor 64 with the collector of transistor 56 and the base of transistor 58. The emitter of transistor 68 is connected through a diode 70 to the collector of transistor 62 and to the output terminal 72A. The emitter of transisor 62 is connected to ground. The other output terminal 72B is connected to ground. The collector of transistor 68 is connected to terminal 21A of the source of operating potential 21 through a resistor 69. The interelectrode capacitance which has to be charged up before an output can be derived from transistor 56 is represented by the dotted capacitor 72. A capacitive load 50 is connected across output terminals 72A and 72B.

With no coincident energizing signals being applied to the And gate inputs, transistors 52, 56 and 62 are nonconductive. Transistor 58, although biased to its conductive state by reason of the signal applied to its base, cannot conduct any current because it is connected in series with transistor 52. Transistor 68 is biased conductive also, and it will provide a current which flows through it and through diode 70 to charge up the capacitive load 50. When the load is charged up, it blocks the flow of further current thereto. Upon the application of an enabling signal to transistor 52 from the junction 16 of the And gate, transistor 52 is rendered conductive whereby a charging current can flow through transistor 58, and transistor 52 to the stray capacitor 72. Upon capacitor 72 being charged up, transistor 56 is rendered conductive whereby the potential applied to the base of transistor 58 and transistor 68 drops, thus cutting off the heavy capacitance charging current. Resistor 20 provides sufficient current through transistor 52 to the base of transistor 56 to keep it on for as long as the input signals remain "high." When transistor 56 is rendered conductive, it supplies current to the base of transistor 62 rendering it conductive. This enables capacitor 50 to discharge through the transistor 62. Capacitor 50 will not be charged up again until transistor 62 is rendered nonconductive.

The following component values are provided to illustrate operative embodiments of the embodiments of the invention. However, they are to be considered as illustrative and not as binding.

| Resistors: | Value ohms |
|---|---|
| 20 | 40K |
| 28 | 15K |
| 32 | 3.3K |
| 44 | 1K |
| 54 | 40K |
| 60 | 15K |
| 64 | 21K |
| 66 | 1K |
| 69 | 1K |

The diode equivalent is a Fairchild FD700. The transistor equivalent is a Fairchild 22369. Both of these are sold by the Fairchild Camera & Instrument Corporation.

There has accordingly been described and shown hereinabove a novel, useful arrangement for charging up the stray capacitance found in DTL circuits whereby the speed of switching is considerably increased while the efficienecy of the circuit is maintained; that is, charging current for stray capacitance is permitted to flow only so long as needed.

What is claimed is:

1. In a circuit having a first and second transistor each having a base, collector, and emitter, means coupling an input signal to the base of said first transistor, a diode coupling the emitter of said first transistor to the base of said second transistor, two input terminals for coupling said circuit to a source of operating potential, a resistance means coupling the collector of said second transistor to one input terminal, and means coupling the emitter of said second transistor to the other input terminal, the improvement comprising a means for charging stray capacitance of said circuit, said means including current conducting means connected between the collector of said second transistor and the collector of said first transistor for enabling a large current to flow to said first transistor when said first transistor is placed into the active region, to charge said stray capacitance until said second transistor is placed into the active region.

2. In a circuit having a first and second transistor each having a base, collector, and emitter, means coupling an input signal to the base of said first transistor, a diode coupling the emitter of said first transistor to the base of said second transistor, two input terminals for coupling said circuit to a source of operating potential, resistance means coupling the collector of said second transistor to one of said input terminals, means coupling the emitter of said second transistor to the other of said terminals, the improvement comprising a means for charging the stray capacitance of said circuit, said means comprising a third transistor having base, emitter, and collector electrodes, a means coupling the base of said third transistor to the collector of said second transistor, means coupling the emitter of said third transistor to the collector of said first transistor, and a resistance means coupling the collector of said third transistor to the said one of said terminals.

3. A high speed switching circuit comprising a first and second transistor each having base, emitter and collector electrodes, means coupling an input signal to the base of said first transistor, means coupling the emitter of said first transistor to the base of said second transistor for placing said second transistor into the active region when said first transistor is placed into the active region, means for applying a signal to the base of said first transistor for placing it into the active region, a pair of input terminals for coupling said circuit to a source of operating potential, a connection between the emitter of said second transistor and one of said terminals, and means coupling the other of said terminals to the collectors of said first and second transistors for reducing current flow to said first transistor when said second transistor is placed into the active region, said last named means including resistor means coupled between said other of said terminals and the collector of said second transistor, and current control means coupled between the collector of said second transistor and the collector of said first transistor.

4. Apparatus as recited in claim 3 wherein said current control means includes a third transistor having collector, emitter, and base, means connecting the base of said third transistor to the collector of said second transistor, resistive means coupling the collector of said third transistor to said other of said terminals, and means coupling the emitter of said third transistor to the collector of said first transistor.

5. Apparatus as recited in claim 3 wherein said current control means includes a diode coupled between the collector of said second transistor and the collector of said first transistor.

6. Apparatus as recited in claim 3 wherein there are included a third and fourth transistor, each having emitter, base and collector electrodes, means connecting the base of said third transistor to the collector of said second transistor, resistive means connecting the collector of said third transistor to said other terminal of said source of operating potential, a diode means connecting the emitter of said third transistor to the collector of said fourth transistor, means connecting the base of said fourth transistor to the emitter of said second transistor, means connecting the emitter of said fourth transistor to said one terminal of said source of operating potential, and means for deriving an output from the collector of said fourth transistor.

References Cited

UNITED STATES PATENTS 3,229,119 1/1966 Bohn et al. ---------- 307—218

ARTHUR GAUSS, *Primary Examiner.*

DAVID CARTER, *Assistant Examiner.*

U.S. Cl. X.R.

307—218, 214, 293, 238